United States Patent [19]
Choi et al.

[11] Patent Number: 5,755,469
[45] Date of Patent: May 26, 1998

[54] WAFER TRANSFER BLADE

[75] Inventors: Sun-yong Choi, Kwacheon; Keun-hong Ryoo; Jin-ho Park, both of Suwon, all of Rep. of Korea

[73] Assignee: Samsung Electronics Co., Ltd., Suwon, Rep. of Korea

[21] Appl. No.: 501,168

[22] Filed: Jul. 11, 1995

[30]  Foreign Application Priority Data

Jul. 11, 1994 [KR] Rep. of Korea ............ 94-16647

[51] Int. Cl.$^6$ ................................................ B25J 15/00
[52] U.S. Cl. ......................... 294/1.1; 294/32; 414/941
[58] Field of Search ....................... 294/1.1, 27.1, 294/32, 34, 64.1–64.3, 902; 414/935, 936, 941; 29/740, 743

[56]  References Cited

U.S. PATENT DOCUMENTS

| | | | |
|---|---|---|---|
| 4,618,178 | 10/1986 | Hutson et al. | 294/64.1 |
| 4,620,738 | 11/1986 | Schwartz et al. | 294/64.1 |
| 4,778,332 | 10/1988 | Byers et al. | 414/941 |
| 4,981,315 | 1/1991 | Poli et al. | 29/743 |
| 5,080,549 | 1/1992 | Goodwin et al. | 294/64.3 |

FOREIGN PATENT DOCUMENTS 2631502  1/1978  Germany ............... 294/64.1

*Primary Examiner*—Dean Kramer
*Attorney, Agent, or Firm*—Cushman Darby & Cushman IP Group of Pillsbury Madison & Sutro LLP

[57]  ABSTRACT

A wafer transfer blade in a wafer transfer arm employed for a semiconductor device manufacturing process, includes a flat region whereon a wafer is loaded; and an end region being integral with the flat region and having a rounded side surface so as to deflect impact on the wafer when colliding with the transfer blade, to thereby reduce wafer edge chipping.

10 Claims, 7 Drawing Sheets

FIG. IA (PRIOR ART)
FIG. IB (PRIOR ART)

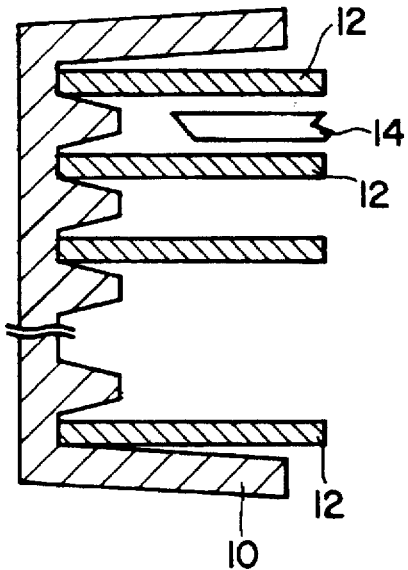
FIG.2(PRIOR ART)
FIG.3A(PRIOR ART)
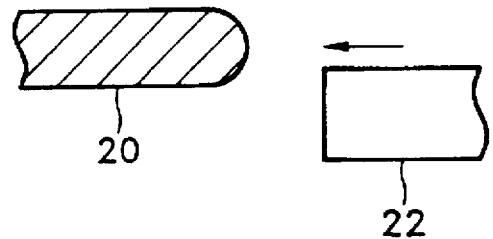
FIG.3B(PRIOR ART)
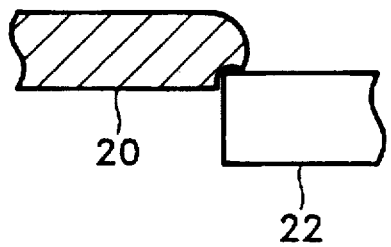

FIG.4A
(PRIOR ART)
FIG.4B
(PRIOR ART)
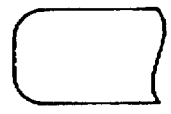
FIG.4C
(PRIOR ART)
FIG.5A
(PRIOR ART)
FIG.5B
(PRIOR ART)
FIG.5C
(PRIOR ART)
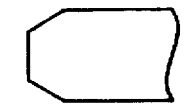
FIG.5D
(PRIOR ART)

curvature R > curvature r curvature R < curvature r

WAFER TRANSFER BLADE

BACKGROUND OF THE INVENTION

The present invention relates to a wafer transfer blade employed for a semiconductor manufacturing device, and more particularly, to a wafer transfer blade for reducing wafer edge chipping generated during a process for manufacturing a semiconductor device.

Wafers undergoing semiconductor device manufacturing processes experience an edge chipping phenomenon, occurring more frequently with wafers having larger diameters, for example, 8-inches and above. Although the exact cause of this phenomenon is unknown, wafer edge chipping occurs in almost every manufacturing process for any semiconductor device and is most often explained using a "stress growth" theory, whereby the stress put on the wafer is said to increase as a wafer cleaning process progresses across the wafer. Edge chipping occurs when the increasing stress reaches a critical threshold at the weakest portion of the wafer, the edge.

The applicant of the present invention, however, has experimented with other causes of the above wafer edge chipping phenomenon, to more accurately define the relation between wafer edge chipping and certain mechanical impacts on the wafer caused by a collision with, for example, a wafer transfer blade. In the inventor's experiment, a wafer and a conventionally angled transfer blade were both placed on a smooth surface having a low friction coefficient and the transfer blade was slid into the wafer.

FIG. 1A and FIG. 1B are photographs for comparing the edge chipping generated in a process for manufacturing a semiconductor device with that generated in the above collision experiment. Here, both the edge chippings have virtually identical shapes. It can therefore be deduced that such mechanical impact on a wafer by a transfer blade when transferring the wafer causes the wafer edge chipping.

This also can explain the more frequent occurrence of the edge chipping phenomenon in larger wafers, since the increase of the wafer's diameter is accompanied by an increase in its thickness and weight. That is, in the operation of a transfer arm for maneuvering a transfer blade to load a wafer, the transfer blade needs to be longer and more stout. A longer blade results in a larger alignment error, and a more stout blade, when combined with the blade's moment, causes greater impacts, both of which increase the occurrence of edge chipping.

FIG. 2 is a section view schematically showing the cross section of a carrier 10, loaded wafers 12 and a transfer arm blade 14 which, being aligned by a manufacturing device, is inserted between the wafers for loading. Here, it should be noted that larger wafers have a greater thickness, which narrows the space between the wafers so that misalignment of the transfer blade is more likely. As a result, the probability of collision between the wafer and transfer blade is increased.

FIG. 3A and FIG. 3B are each side views of a wafer and wafer transfer blade, for explaining wafer edge chipping caused by the structure of a conventional wafer transfer blade. Here, a wafer transfer blade 22 and a wafer 20 are shown before (FIG. 3A) and after contact (FIG. 3B). At the point of contact, wafer edge chipping occurs due to an alignment error in a manufacturing device.

FIG. 4A to FIG. 4C are side views showing examples of a conventional wafer transfer blade. The conventional wafer transfer blade has various shapes according to manufacturer and beveling of the side surfaces thereof. FIG. 4A shows a wafer transfer blade having downward beveling, FIG. 4B shows a wafer transfer blade having upward beveling, and FIG. 4C shows a wafer transfer blade having a blunt end surface. Thus, such wafer transfer blades all have structures in which the portion initially contacting the wafer is sharply angled. Thus, the wafer edge receives a strong impact by collision with the transfer blade, which causes edge chipping.

In the meantime, the edge chipping can be more serious when the above-described beveled end-surface structure is combined with an angular blade as in FIG. 5A to FIG. 5D which are plan views showing various conventional wafer transfer blade structures.

FIG. 6A and FIG. 6B are top views of a wafer W and a transfer blade B for explaining edge chipping caused by the structure of an angular wafer transfer blade as in FIG. 5A. FIG. 6A shows the case of normal wafer orientation, with FIG. 6B showing abnormal wafer orientation. In FIG. 6A, the transfer blade will meet flush with the wafer's chamfer. However, in FIG. 6B, the point of contact is a sharp corner of the transfer blade, which aggravates chipping.

Moreover, wafer edge chipping caused by a collision of the transfer blade with the wafer leads to further chipping in subsequent processing. This additional chipping can contaminate the manufactured product, to thereby lower the yield and reliability of a semiconductor device.

SUMMARY OF THE INVENTION

Accordingly, it is an object of the present invention to provide a wafer transfer blade for minimizing wafer edge chipping.

To accomplish the object of the present invention, there is provided a wafer transfer blade in a wafer transfer arm employed for a semiconductor device manufacturing process, the wafer transfer blade comprising: a flat region whereon a wafer is loaded; and an end portion being integral with the flat region and having a rounded side surface so as to deflect impact on the wafer when the transfer blade collides with the wafer.

Here, it is desirable that the rounded end portion is polished to reduce friction that occurs when the transfer arm collides with the wafer.

Meanwhile, the cross-section of the end portion may be shaped as a semicircle whose radius is T/2, where T is the thickness of the flat region of the transfer blade. In addition, if a curvature radius of the starting point of the edge portion is R and a curvature radius of the ending point of the edge portion is r, R may be larger or smaller than r.

According to another embodiment of the present invention, the top and bottom surfaces of the end portion slope symmetrically toward the tip of the transfer blade, starting from the flat region thereof, and the portion where the top and bottom surfaces meet is rounded.

In addition, the top surface of the end portion is sloped toward the tip of the transfer blade, the bottom surface of the end portion is flat and the portion where the top and bottom surfaces contact is rounded. The top surface of the end portion is flat, the bottom surface of the end portion is sloped toward the tip of the transfer blade and the portion where the top and the bottom surface contact is rounded. Here, the sloping top or bottom surface has at least one curve.

BRIEF DESCRIPTION OF THE DRAWINGS

The above objects and other advantages of the present invention will become more apparent by describing in detail

Figure 6A:
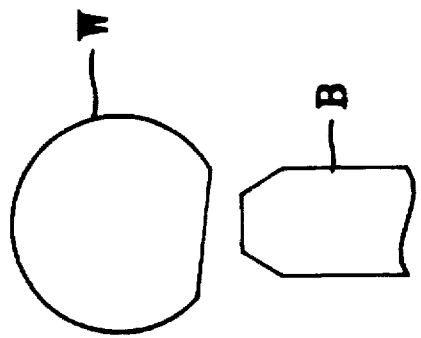
Figure 6B:
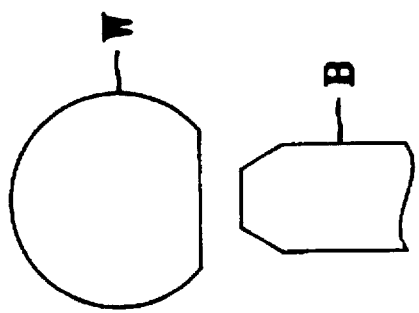
Figure 7B:
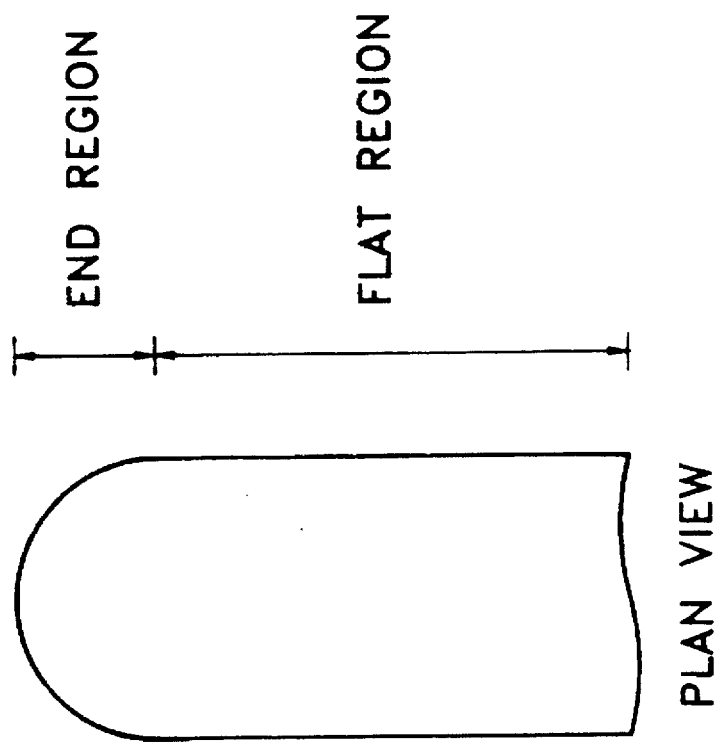
Figure 7A:
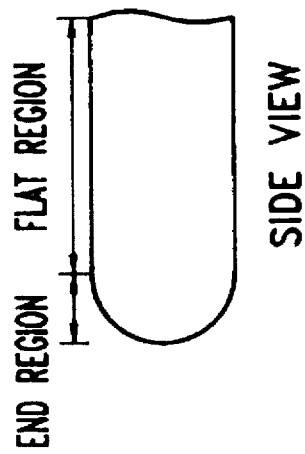

3 a preferred embodiment thereof with reference to the attached drawings in which:

FIG. 1A and FIG. 1B are photographs for comparing wafer edge chipping generated in a manufacturing process and in a collision experiment, respectively;

FIG. 2 is a view showing sections of a carrier, wafers and a transfer arm blade for explaining wafer edge chipping generated when the wafer is loaded;

FIG. 3A and FIG. 3B are each side views of a wafer and a transfer blade for explaining wafer edge chipping caused by the structure of a conventional wafer transfer blade;

FIG. 4A to FIG. 4C are side views showing examples of a conventional wafer transfer blade;

FIG. 5A to FIG. 5D are plan views showing examples of a conventional wafer transfer blade;

FIG. 6A and FIG. 6B are top views showing wafer edge chipping caused by the structure of a conventional wafer transfer blade;

FIG. 7A and FIG. 7B are a side view and a top view of a wafer transfer blade according to the present invention, respectively; and FIG. 8A to FIG. 8H are all side views of various embodiments of the present invention.

DETAILED DESCRIPTION OF THE INVENTION

First, as shown in FIG. 7A and 7B, the transfer blade employed for a process for manufacturing a semiconductor can be divided into a flat region whereon the wafer is loaded and an end portion located at an end of the transfer blade.

FIG. 7A is a side view of a transfer blade of the present invention. Here, different from the conventional angular transfer blade, the cross-section of the end portion is rounded so as to deflect impact on the wafer when the transfer blade collides with the wafer.

FIG. 7B is a plan view of a transfer blade of the present invention. Here, the top surface of the end portion of the transfer blade is also rounded. Thus, in the present invention, in contrast to the conventional transfer blade which has an end portion whose side and plan views are both sharply angled, the transfer blade's end portion is rounded with respect to both the side view and the plan view, so that impact on the wafer can be deflected when the transfer blade collides with the wafer, to thereby reduce edge chipping.

Furthermore, the transfer blade according to the present invention is also polished. Thus, the end surfaces are smooth, which reduces friction when the transfer blade collides with the wafer, so that wafer edge chipping can be further reduced.

FIG. 8A to FIG. 8H show various embodiments of the transfer blade according to the present invention, wherein the end portions are rounded.

Figure 8A:
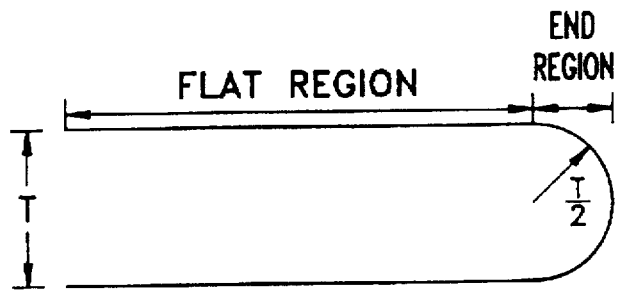

FIG. 8A shows a transfer blade having an end shaped as a semicircle whose radius is T/2, where T is the thickness of the flat region of the transfer blade.

Figure 8B:
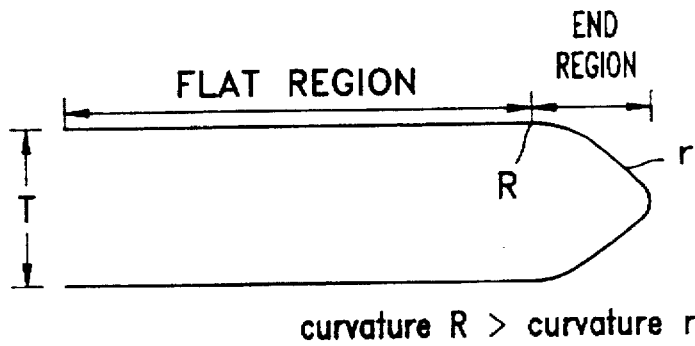

FIG. 8B shows a transfer blade having an end whose cross-section has a start-point curvature radius R larger than endpoint curvature radius r.

Figure 8C:
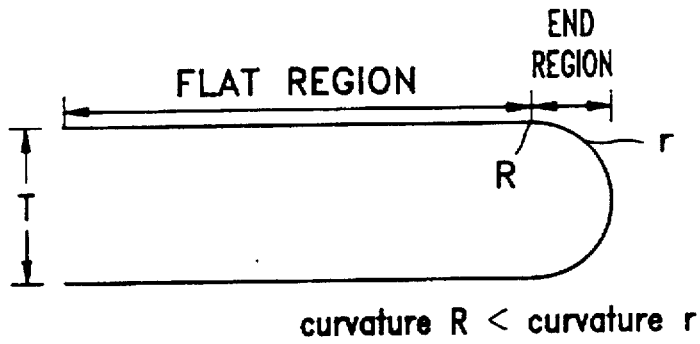

FIG. 8C shows a transfer blade having an end whose cross-section side surface has a start-point curvature radius R smaller than endpoint curvature radius r.

Figure 8D:
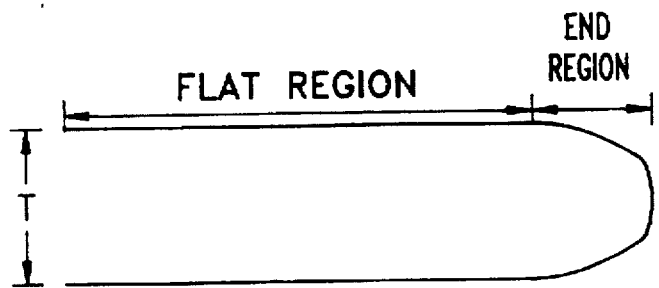

FIG. 8D shows a transfer blade having an end whose top and bottom surfaces both slope symmetrically toward the tip of he end portion, and wherein the portion where the top and bottom surfaces meet is rounded.

4

Figure 8E:
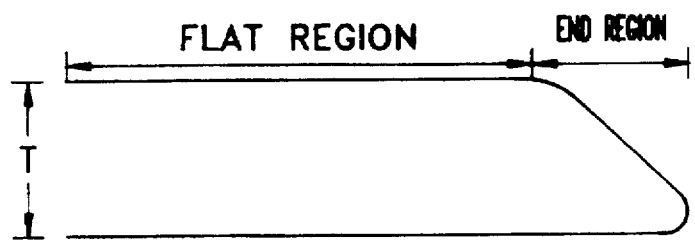

FIG. 8E shows a transfer blade having an end whose top surface slopes toward the tip of the end portion, and wherein the portion where the top and bottom surfaces meet is rounded.

Figure 8F:
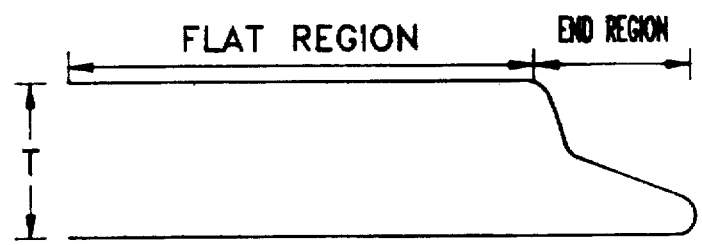

FIG. 8F shows the transfer blade of FIG. 8E wherein the top surface of the end portion includes a curve.

Figure 8G:
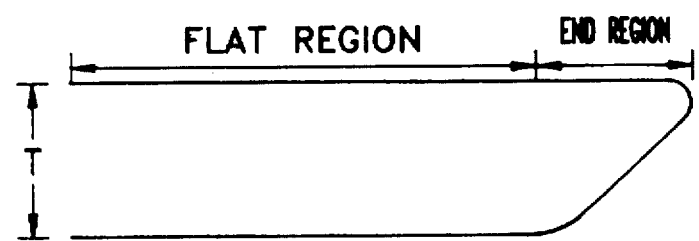

FIG. 8G shows a transfer blade having an end whose bottom surface slopes toward the tip of the end portion, and wherein the portion where the top and bottom surfaces meet is rounded.

Figure 8H:
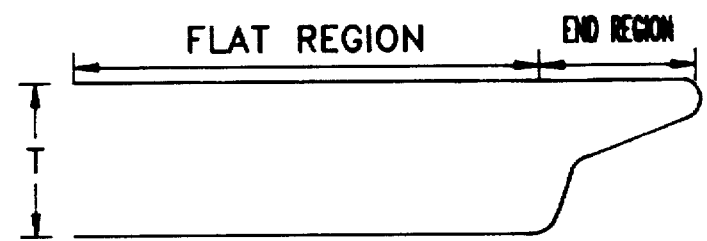

FIG. 8H shows the transfer blade of FIG. 8G wherein the bottom surface of the end portion includes a curve.

As described above, in a wafer transfer blade employed for a process for manufacturing a semiconductor device, the end of the transfer blade are rounded with respect to both side and top views. Thus, if the wafer orientation deviates from the normal position due to an error in a manufacturing device or if misalignment of the transfer arm occurs during wafer loading, such that the transfer blade collides with the wafer, impact on the wafer can be deflectd. In addition, the transfer blade end surfaces are polished, which reduces friction at the time of collision between the transfer blade and wafer. As a result, wafer edge chipping can be reduced.

The thus-achieved reduction of the wafer edge chipping prevents the manufacturing environment from being contaminated with wafer chips, to thereby increase yield and reliability of a manufactured semiconductor device. Further, next-generation wafers, which tend to have larger diameters (i.e., eight inches and above), can be utilized in conventional processes, to thereby enhance productivity.

Although the present invention is explained by exemplifying several types of transfer blades, the spirit of the present invention is not limited thereto. Any transfer blades having a rounded end portion is in the scope of the present invention. It is further understood by those skilled in the art that the foregoing description represents preferred embodiments of the disclosed device and that various changes and/or modifications may be made in the invention without departing from the spirit and scope thereof.

What is claimed is:

1. A wafer transfer blade for use in a wafer transfer arm employed for a semiconductor device manufacturing process, said wafer transfer blade comprising:

a flat region adapted to receive a wafer, and an end portion being integral with said flat region and having a rounded surface;

wherein said rounded surface is circumferentially positioned between said flat region and said end portion to provide a transition between said end portion and said flat region so that said end portion will function to deflect impact on said wafer upon collision of said transfer blade with said wafer, and wherein said rounded surface of said end portion has a start-point curvature radius which is larger than its endpoint curvature radius.

2. A wafer transfer blade according to claim 1 wherein said rounded surface is a top surface of said end portion.

3. A wafer transfer blade according to claim 1 wherein a side surface of said end portion forms a semicircle having a radius of T/2, where T is the thickness of said flat region of said transfer blade.

4. A wafer transfer blade for use in a wafer transfer arm employed for a semiconductor device manufacturing process, said wafer transfer blade comprising:

a flat region adapted to receive a wafer; and an end portion being integral with said flat region and having a rounded surface:

wherein said rounded surface is circumferentially positioned between said flat region and said end portion to provide a transition between said end portion and said flat region so that said end portion will function to deflect impact on said wafer upon collision of said transfer blade with said wafer, and wherein said rounded surface of said end portion has a start point curvature radius which is smaller than its end point curvature radius.

5. A wafer transfer blade according to claim 4 wherein both top and bottom surfaces of said end portion slope symmetrically toward a tip of said end portion and a portion where said top and bottom surfaces meet is rounded.

6. A wafer transfer blade according to claim 4 wherein only a top surface of said end portion slopes toward a tip of said end portion where said top surface and a bottom surface of said end portion meet is rounded.

7. A wafer transfer blade according to claim 4 wherein only a bottom surface of said end portion slopes toward a tip of said end portion and a portion where a top surface of said end portion and said bottom surface meet is rounded.

8. A wafer transfer blade according to claim 4 wherein said rounded surface of said end portion is polished so as to reduce friction when said transfer blade collides with said wafer.

9. A wafer transfer blade for use in a wafer transfer arm employed for a semiconductor device manufacturing process said wafer transfer blade comprising:

a flat region adapted to receive a wafer; and an end portion being integral with said flat region and having a rounded surface;

wherein said rounded surface is circumferentially positioned between said flat region and said end portion to provide a transition between said end portion and said flat region so that said end portion will function to deflect impact on said wafer upon collision of said transfer blade with said wafer, and wherein only a top surface of said end portion slopes toward a tip of said end portion and a portion where said top surface and a bottom surface of said end portion meet is rounded, an wherein said top surface of said end portion includes at least one curve.

10. A wafer transfer blade for use in a wafer transfer arm employed for a semiconductor device manufacturing process, said wafer transfer blade comprising:

a flat region adapted to receive a wafer; and an end portion being integral with said flat region and having a rounded surface;

wherein said rounded surface is circumferentially positioned between said flat region and said end portion to provide a transition between said end portion and said flat region so that said end portion will function to deflect impact on said wafer upon collision of said transfer blade with said wafer, and wherein only a bottom surface of said end portion slopes toward a tip of said end portion and a portion where a top surface of said end portion and said bottom surface meet is rounded, and wherein said bottom surface of said end portion includes at least one curve.

* * * * *